(12) United States Patent
Liu

(10) Patent No.: US 7,294,866 B2
(45) Date of Patent: Nov. 13, 2007

(54) FLIP-CHIP LIGHT-EMITTING DEVICE WITH MICRO-REFLECTOR

(75) Inventor: Wen-Huang Liu, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 10/906,572

(22) Filed: Feb. 24, 2005

(65) Prior Publication Data

US 2005/0189558 A1 Sep. 1, 2005

(30) Foreign Application Priority Data

Mar. 1, 2004 (TW) .............................. 93105367 A

(51) Int. Cl.
*H01L 27/15* (2006.01)
*H01L 29/24* (2006.01)

(52) U.S. Cl. .................... 257/100; 257/94; 257/98; 257/99; 257/79; 257/81; 257/100; 257/E33.067; 257/E33.072

(58) Field of Classification Search ................ 257/99, 257/79, 81, 98, 100, E33.064, E33.072, E33.067, 257/94
See application file for complete search history.

(56) References Cited

U.S. PATENT DOCUMENTS 6,730,940 B1   5/2004   Steranka
6,876,005 B2   4/2005   Hsieh et al.
6,900,473 B2   5/2005   Yoshitake
6,914,268 B2 * 7/2005   Shei et al. ..................... 257/99
6,946,788 B2   9/2005   Suehiro
2002/0017652 A1   2/2002   Illek et al.
2002/0025122 A1 * 2/2002   Ouchi et al. .................. 385/88
2002/0030194 A1   3/2002   Camras
2002/0093023 A1 * 7/2002   Camras et al. ................ 257/94
2002/0105003 A1   8/2002   Yang
2003/0141507 A1 * 7/2003   Krames et al. ................ 257/79
2004/0119082 A1 * 6/2004   Sugawara ..................... 257/94
2005/0087884 A1 * 4/2005   Stokes et al. ................. 257/778
2005/0167690 A1 * 8/2005   Gardner et al. ............. 257/103
2006/0231852 A1 * 10/2006   Kususe et al. ................ 257/99

FOREIGN PATENT DOCUMENTS

| CN | 1395321 A | 2/2003 |
| DE | 200 19 477 U1 | 1/2004 |
| DE | 103 31 825 A1 | 2/2004 |
| EP | 1 276 158 A2 | 1/2003 |

* cited by examiner

*Primary Examiner*—Jerome Jackson
*Assistant Examiner*—Joseph Nguyen
(74) *Attorney, Agent, or Firm*—Winston Hsu

(57) ABSTRACT

A Flip-chip light-emitting device with integral micro-reflector. The flip-chip light-emitting device emits reflected light provided by a light-emitting layer. The micro-reflector reflects light that might otherwise be lost to internal refraction and absorption, so as to increase light-emitting efficiency.

18 Claims, 4 Drawing Sheets

FLIP-CHIP LIGHT-EMITTING DEVICE WITH MICRO-REFLECTOR

BACKGROUND OF INVENTION

1. Field of the Invention

The present invention provides a light-emitting device, and more particularly, a flip-chip light-emitting device with a micro-reflector.

2. Description of the Prior Art

The applications of light-emitting diodes are extensive and include optical display devices, traffic signals, data storing devices, communication devices, illumination devices, and medical apparatuses. As such, it is important to increase the brightness of light-emitting diodes, and to simplify manufacturing processes in order to decrease the cost of the light-emitting diode.

Please refer to FIG. 1, which illustrates a schematic diagram of a flip-chip light-emitting device and its related method of manufacture disclosed in TW patent 441 859, in which a first electrode and a second electrode of the flip-chip light-emitting device bring reflected light out from a light-emitting layer. Nevertheless, the prior art method, due to the reason that only light emitted at an angle within the critical angle θc would be completely emitted out, and other light would be reflected and absorbed, has a limited viewing angle and a readily identifiable source of inefficiency in the form of internal absorption of emitted light. In other words, the angle of light of the flip-chip light-emitting device must be within a cone of 2θc to be completely emitted out. Light emitted at an angle larger than 2θc is reflected and absorbed. When light generated within the flip-chip light-emitting device travels from a material with a high refractive index to a material with a low refractive index, the angle of light emitted is limited due to the effect of said refractive indexes. Therefore, an important issue is how to improve the efficiency of light emission, with respect to both viewing angle and intensity.

SUMMARY OF INVENTION

It is therefore a primary objective of the claimed invention to provide a flip-chip light-emitting device with a micro-reflector. The micro-reflector includes a transparent patterned light-emitting stack layer. The transparent patterned light-emitting stack layer may be formed into a variety of shapes, including semicircular, pyramidical, conical, and so on, and can be continuous or discontinuous. The transparent patterned light-emitting stack layer is generated by means of etching on a light-emitting stack layer of the flip-chip light-emitting device, of evaporation deposition, or of a bonding method. Then, a reflective layer is formed over the transparent patterned light-emitting stack layer by means of evaporation deposition, so that the reflective layer includes the specific shapes to form a micro-reflector. The micro-reflector reflects vertical light with incoming light provided by a light-emitting area, so that the normal incidence light is un-affected by the critical angle for improving light extraction.

Briefly described, the claimed invention discloses a flip-chip light-emitting device with a micro-reflector. The flip-chip light-emitting device with a micro-reflector includes a substrate, a semiconductor stack layer formed over the substrate with a first surface and a second surface, a light-emitting layer formed over the first surface, a semiconductor formed over the light-emitting layer, a micro-reflector formed over the second semiconductor with a transparent patterned layer, a first electrode formed over the reflective layer, and a second electrode formed over the second surface.

The substrate comprises at least one material selected from a material group consisting of GaP, glass, SiC, GaN, ZnSe, and sapphire or other substitute materials. The reflective layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide, or other substitute materials. The shape of the transparent patterned layer corresponds to at least one graph profile selected from a graph profile group consisting of semicircular, pyramidical, conical, or other substitute graph profiles. The first semiconductor stack layer comprises at least one material selected from a material group consisting of AlGaInP, AlInP, AlN, GaN, AlGaN, InGaN, and AlInGaN, or other substitute materials. The light-emitting layer comprises at least one material selected from a material group consisting of AlGaInP, GaN, InGaN, and AlInGaN, or other substitute materials. The second semiconductor stack layer comprises at least one material selected from a material group consisting of AlGaInP, AlInP, AlN, GaN, AlGaN, InGaN, and AlInGaN, or other substitute materials.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
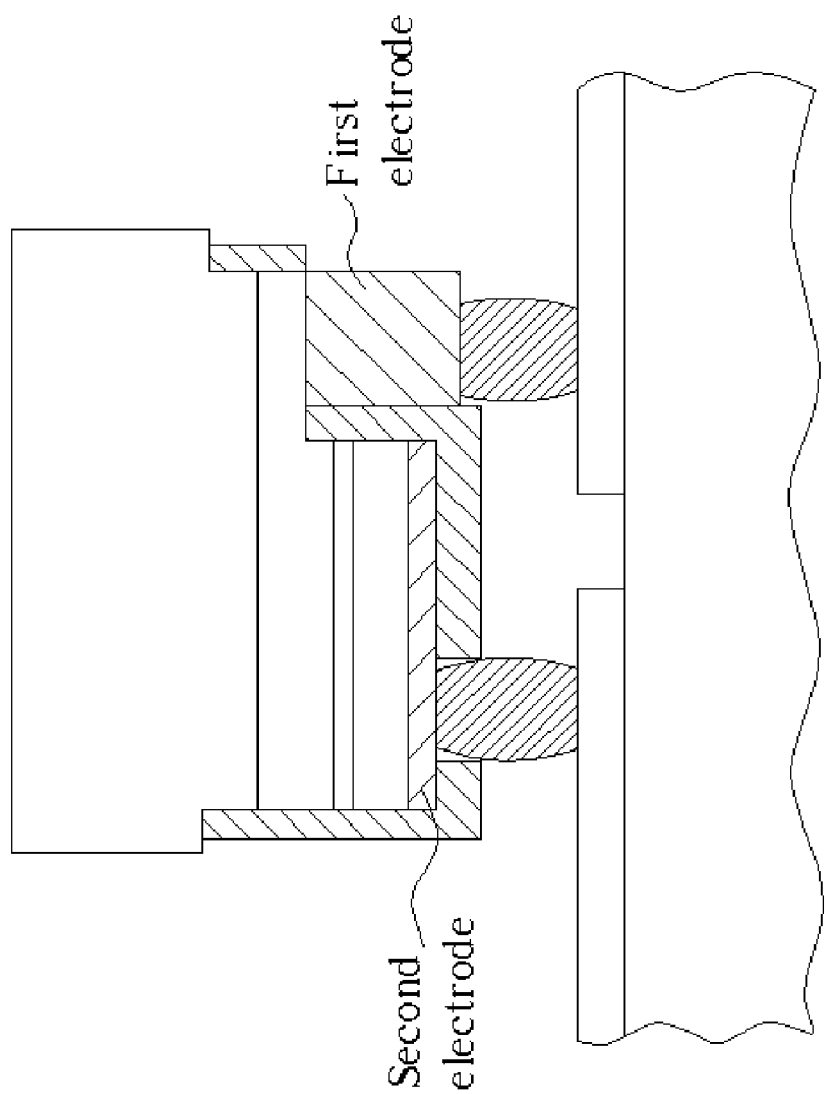
FIG. 1 illustrates a schematic diagram of a prior art flip-chip light-emitting device.
Figure 2:
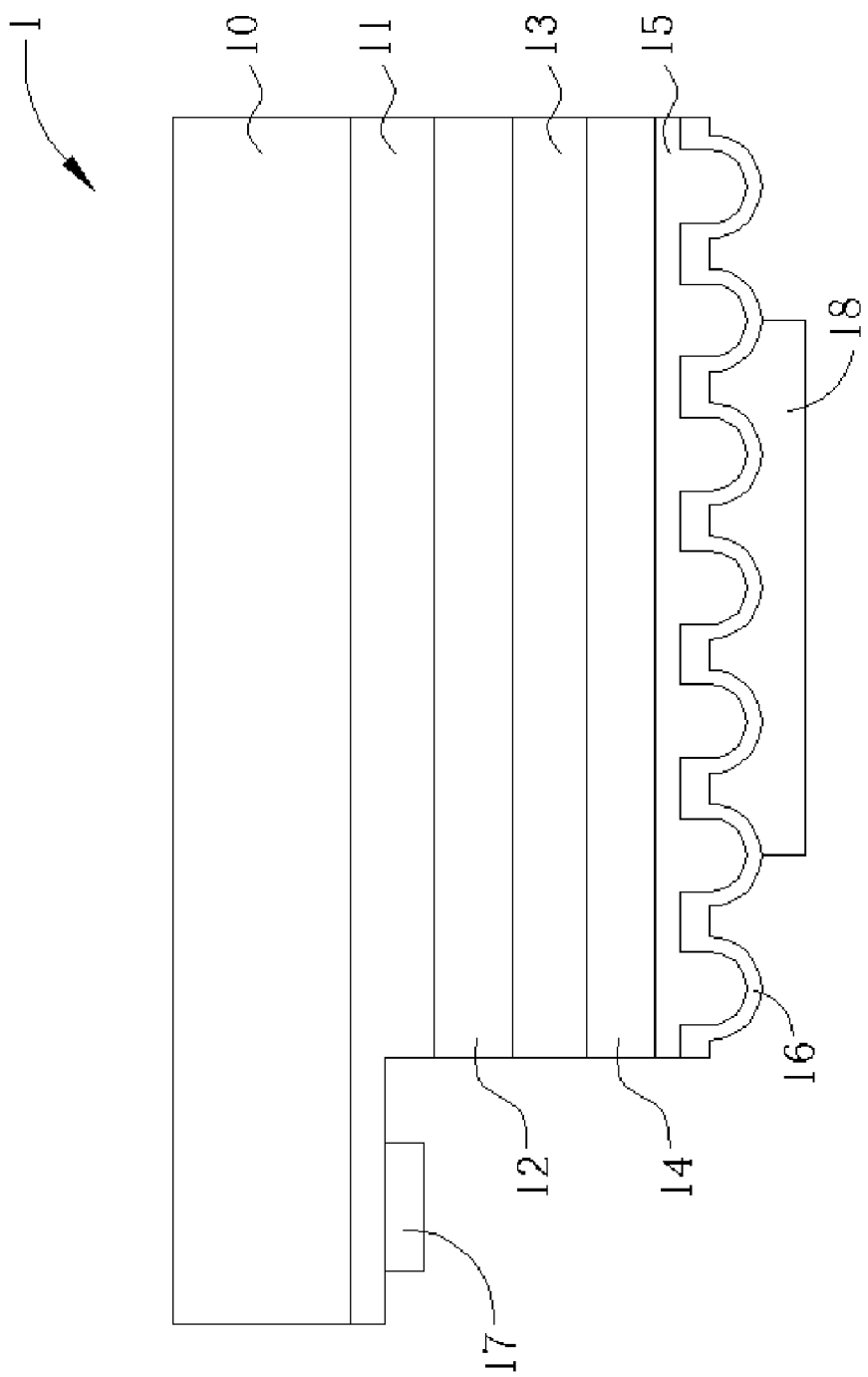
FIG. 2 illustrates a schematic diagram of a present invention flip-chip light-emitting device with a micro-reflector.

Please refer to FIG. 2, which illustrates a schematic diagram of a flip-chip light-emitting device 1 with a micro-reflector. The light-emitting device 1 includes a transparent substrate 10, a first contact layer 11 with a first surface and a second surface on an upper surface formed over the transparent substrate 10, a first cladding layer 12 formed over the first surface, a light-emitting layer 13 formed over the first cladding layer 12, a second cladding layer 14 formed over the light-emitting layer 13, a micro-reflector with a second contact layer 15 formed over the second cladding layer 14, a reflective layer 16 formed over the second contact layer 15, a first electrode 17 formed over the second surface, and a second electrode 18 formed over the reflective layer 16. The second contact layer 15 includes transparent patterned shapes, which can be continuous, or discontinuous.

Figure 3:
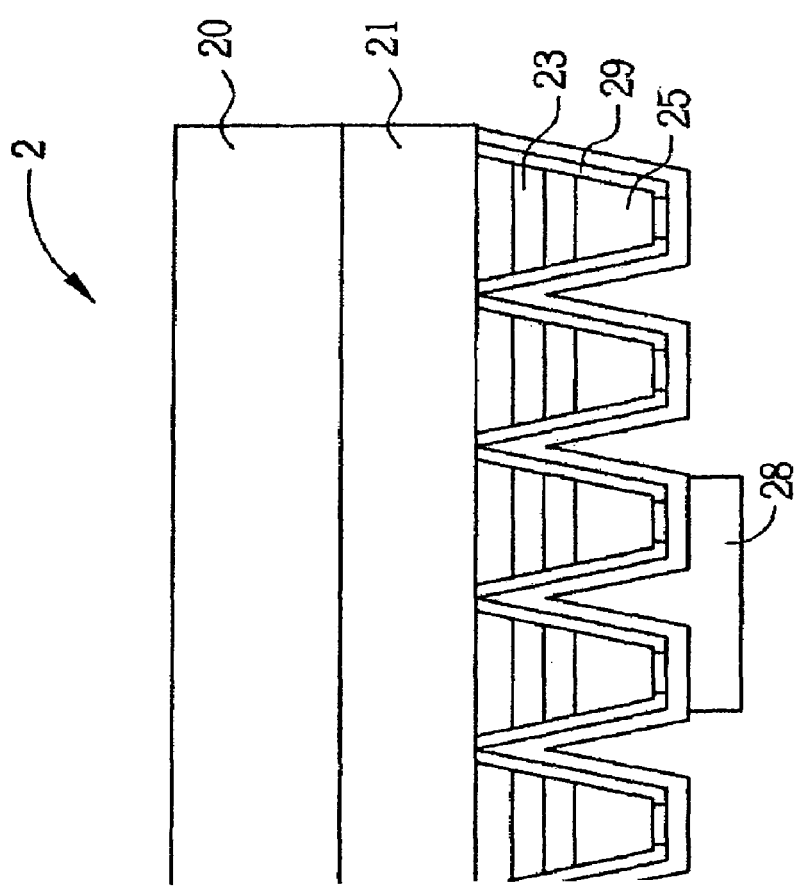
FIG. 3 illustrates a schematic diagram of a present invention flip-chip light-emitting device with a micro-reflector.

Please refer to FIG. 3, which illustrates a schematic diagram of a lightemitting device 2 with a micro-reflector. The light-emitting device 2 includes a transparent substrate 20, a first contact layer 21 with a first surface and a second surface on an upper surface formed over the transparent substrate 20, a micro-reflector with a transparent patterned light-emitting stack layer formed over the first surface of the first contac layer 21, an insulating layer 29 formed around the transparent patterned light-emitting stack layer, and a reflective layer 26 formed over the insulating layer 29 and an the transparent patterned light-emitting stack layer, an ohmic contact between the reflective layer 26 and the transparent patterned light-emitting stack layer, a first cladding layer 22 of the transparent patterned light-emitting stack layer formed over the first surface of the first contact layer, a light-emitting layer 23 formed over the firstcladding layer 22, a second cladding layer 24 formed over the lightemitting layer 23, a second contact layer 25 formed over the second cladding layer 24, a first electrode 27 formed over the second surface of the first contact layer 21, and a second electrode 28 formed over the reflective layer 26. The transparent patterned light-emitting stack layer includes spread transparent geometric shapes, which can be continuous, or discontinuous.

Figure 4:
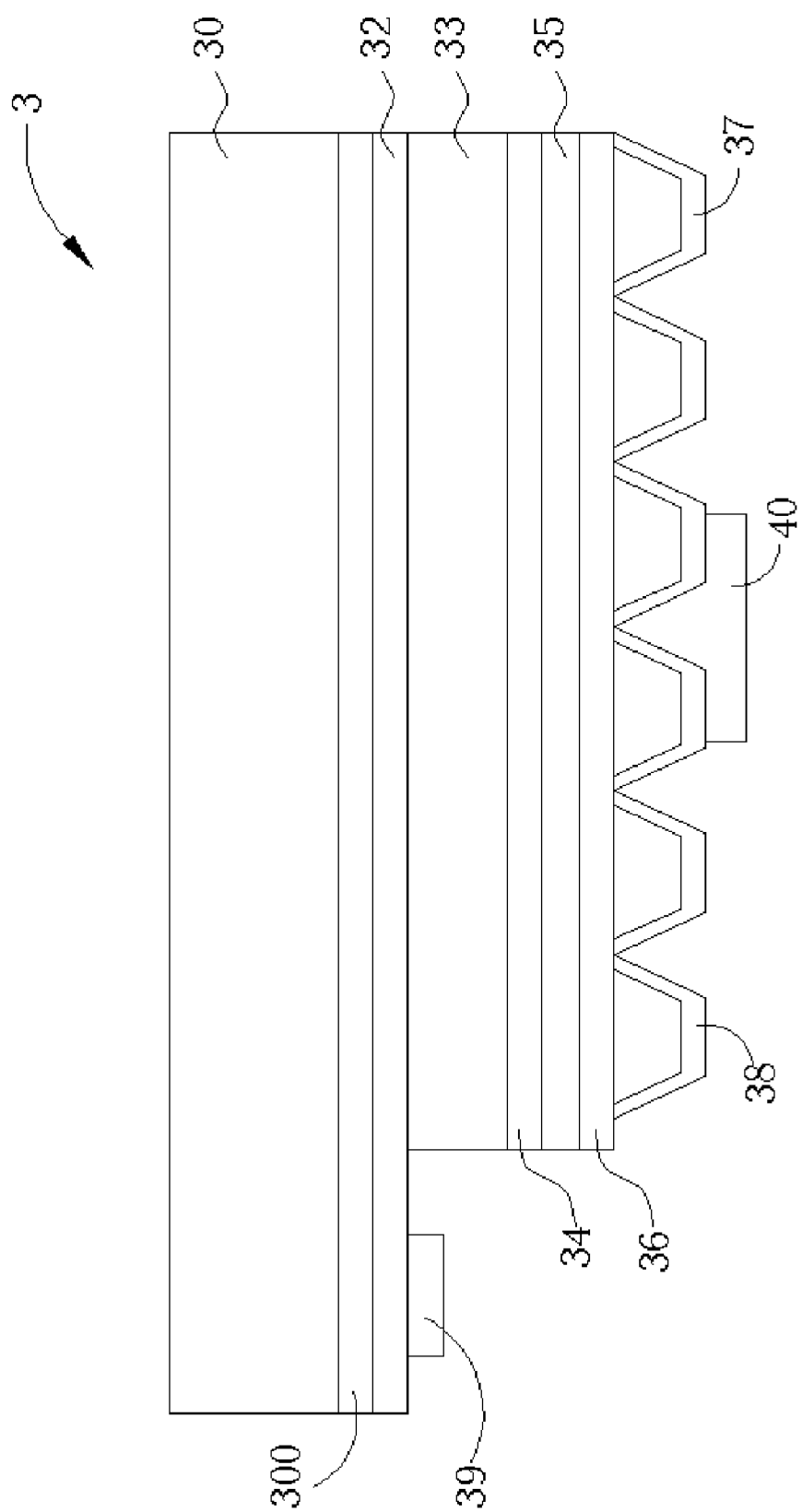
FIG. 4 illustrates a schematic diagram of a present invention flip-chip light-emitting device with a micro-reflector.

Please refer to FIG. 4, which illustrates a schematic diagram of a light-emitting device 3 with a micro-reflector. In light-emitting device 3, a chip is bonded onto a transparent substrate by means of direct pressure bonding, or transparent adhesive layer bonding. The light-emitting device 3 includes a transparent bonding substrate 30, a bonding interface 300 formed over the transparent bonding substrate 30, a transparent conductive layer 32 with a first surface and a second surface formed over the bonding interface 300, a first contact layer 33 formed over the first surface, a first cladding layer 34 formed over the first contact layer 33, a light-emitting layer 35 formed over the first cladding layer 34, a second cladding layer 36 formed over the light-emitting layer 35, a micro-reflector with a second contact layer 37 formed over the second cladding layer 36, a reflective layer 38 formed over the second contact layer 37, a first electrode 39 formed over the second surface, and a second electrode 40 formed over the reflective layer 38. The bonding interface 300 can be formed from adhesive, semiconductor material, transparent oxide, or a transparent metal layer for bonding the substrate 30 to the first contact layer 33, In the above-mentioned three embodiments, a transparent conductive layer can be between the second electrode and the reflective layer. The transparent patterned shape corresponds to at least one graph profile selected from a graph profile group consisting of semicirclular, pyramidical, conical, or other substitute graph profiles. The transparent substrate includes at least one material selected from a material group consisting of GaP, glass, SiC, GaN, ZnSe, and sapphire or other substitute materials. The reflective layer includes at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide, or other substitute materials. The transparent conductive layer includes at least one material selected from a material group consisting of indium tin oxide, cadmium tin oxide, antimony tin oxide, zinc oxide, zinc tin oxide, Be/Au, Ge/Au and Ni/Au, or other substitute materials. The first cladding layer includes at least one material selected from a material group consisting of AlGaInP, AlInP, AlN, GaN, AlGaN, InGaN, AlInGaN, and ZnSe, or other substitute materials. The light-emitting layer includes at least one material selected from a material group consisting of AlGaInP, GaN, InGaN, AlInGaN, and ZnSe, or other substitute materials. The second cladding layer includes at least one material selected from a material group consisting of AlGaInP, AlInP, AlN, GaN, AlGaN, InGaN, AlInGaN, and ZnSe, or other substitute materials. The second contact layer includes at least one material selected from a material group consisting of GaP, GaAs, GaAsP, InGaP, AlGaInP, AlGaAs, GaN, InGaN, AlGaN, and ZnSe, or other substitute materials. The first contact layer includes at least one material selected from a material group consisting of GaP, GaAs, GaAsP, InGaP, AlGaInP, AlGaAs, GaN, InGaN, AlGaN, and ZnSe, or other substitute materials. The insulating layer includes at least one material selected from a material group consisting of SiNx and SiO2, or other substitute materials.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A flip-chip light-emitting device with a micro-reflector comprising:
   a substrate;
   a micro-reflector formed over the substrate, the micro-reflector comprising:
      a transparent patterned light-emitting stack layer having a plurality of convex surfaces opposite to the substrate; and
      a reflective layer formed conformably over the transparent patterned light-emitting stack layer;
   wherein the transparent patterned light-emitting stack layer comprises a first cladding layer, a light-emitting layer, and a second cladding layer; and
   wherein the plurality of convex surfaces reach at least one of the first cladding layer and the second cladding layer.

2. The flip-chip light-emitting device with a micro-reflector of claim 1 further comprising a first contact layer between the first cladding layer the substrate.

3. The flip-chip light-emitting device with a micro-reflector of claim 1 further comprising a second contact layer between the second cladding layer and the reflective layer.

4. The flip-chip light-emitting device with a micro-reflector of claim 1 further comprising a transparent conductive layer between the transparent patterned light-emitting stack layer and the substrate.

5. The flip-chip light-emitting device with a micro-reflector of claim 4 wherein the transparent conductive layer comprises a material selected from a material group consisting of indium tin oxide, cadmium tin oxide, antimony tin oxide, zinc oxide, and zinc tin oxide.

6. The flip-chip light-emitting device with a micro-reflector of claim 1 further comprising an adhesive layer between the micro-reflector and the substrate.

7. The flip-chip light-emitting device with a micro-reflector of claim 6 further comprising a first reaction layer between the adhesive layer and the substrate.

8. The flip-chip light-emitting device with a micro-reflector of claim 6 further comprising a second reaction layer between the adhesive layer and the micro-reflector.

9. The flip-chip light-emitting device with a micro-reflector of claim 6 wherein the adhesive layer comprises a material selected from a material group consisting of adhesive, semiconductor, and transparent metal.

10. The flip-chip light-emitting device with a micro-reflector of claim 1 further comprising an insulating layer between the transparent patterned light-emitting stack layer and the reflective layer.

11. The flip-chip light-emitting device with a micro-reflector of claim 10 wherein the insulating layer comprises a material selected from a material group consisting of SiNx and SiO2.

12. The flip-chip light-emitting device with a micro-reflector of claim 1 further comprising a first electrode and a second electrode formed at a front side of the flip-chip light-emitting device, far from the substrate.

13. The flip-chip light-emitting device with a micro-reflector of claim 1 further comprising a first electrode formed at a front side of the flip-chip light-emitting device, and a second electrode formed at a side of the substrate far from the first electrode.

14. The flip-chip light-emitting device with a micro-reflector of claim 1 wherein the substrate comprises a material selected from a material group consisting of GaP, Sic, GaN, ZnSe, glass, and sapphire.

15. The flip-chip light-emitting device with a micro-reflector of claim 1 wherein the reflective layer comprises a material selected from a material group consisting of Sn, Al, Au, Pt, Zn, Ag, Ti, Pb, Pd, Ge, Cu, AuBe, AuGe, Ni, PbSn, AuZn, and indium tin oxide.

16. The flip-chip light-emitting device with a micro-reflector of claim 1 wherein the substrate is connected to the micro-reflector with a direct wafer bonding.

17. The flip-chip light-emitting device with a micro-reflector of claim 1 wherein the shape of said plurality of concave surfaces is semicircular, pyramidical, or conical.

18. The flip-chip light-emitting device with a micro-reflector of claim 1 wherein the transparent patterned light-emitting stack layer is divided into a plurality of separated stack structures, and the transparent patterned light-emitting stack layer has a plurality of convex surfaces opposite to the substrate, with each separated stack structure forming one of the convex surfaces.

* * * * *